United States Patent [19]

Held

[11] Patent Number: 4,755,252
[45] Date of Patent: Jul. 5, 1988

[54] DOUBLE-BAND PRESS FOR CONTINUOUS PRODUCTION OF COPPER-LINED LAMINATES WITH AUXILIARY CLEANING EQUIPMENT

[76] Inventor: Kurt Held, Alte Strasse 1, D-7218 Trossingen 2, Fed. Rep. of Germany

[21] Appl. No.: 907,962

[22] Filed: Sep. 16, 1986

[30] Foreign Application Priority Data

Sep. 19, 1985 [DE] Fed. Rep. of Germany ....... 3533413

[51] Int. Cl.$^4$ .................. B32B 31/08; B30B 5/06; B30B 15/08
[52] U.S. Cl. .................. 156/389; 156/497; 156/555; 156/582; 156/583.5; 100/93 RP; 100/102; 100/153; 15/256.51; 198/494; 198/498
[58] Field of Search .............. 156/581, 582, 584, 389, 156/497, 536, 535, 555, 583.5; 100/93 RP, 102, 153, 100, 70 R; 15/256.5, 256.51; 198/494, 498, 499; 51/136

[56] References Cited

U.S. PATENT DOCUMENTS

| | | | |
|---|---|---|---|
| 2,018,719 | 10/1935 | Haug | 198/494 |
| 3,583,555 | 6/1971 | Karsnak | 15/256.5 |
| 3,593,700 | 7/1971 | McNulty | 51/267 |
| 4,197,936 | 4/1980 | Fowler | 198/498 |
| 4,290,520 | 9/1981 | Rhodes | 15/256.5 |
| 4,324,327 | 4/1982 | Chouteau | 15/256.5 |
| 4,344,361 | 8/1982 | MacPhee | 198/494 |
| 4,489,823 | 12/1984 | Gordon | 15/256.5 |
| 4,498,577 | 2/1985 | Veenhof | 15/256.5 |

FOREIGN PATENT DOCUMENTS 0516517 7/1977 U.S.S.R. .................. 51/136

Primary Examiner—Jerome Massie
Assistant Examiner—J. Davis
Attorney, Agent, or Firm—Toren, McGeady & Associates

[57] ABSTRACT

In a double-band press for the continuous production of copper-lined laminates, copper foil webs and layered material webs are drawn off rollers and fed to the double-band press, the copper foil webs being placed against press belts of the press in an area between deflecting drums on an inlet side by means of deflecting rollers and are combined with the layered material webs prior to a reaction zone formed between the press belts in order to form a layered formation which is pressed in the reaction zone of the double-band press. In order to disengage resin residues which are hardened on the press belts and which exit from the layered material through holes in the copper foil during pressing and other impurities, a press belt grinding device is arranged at the press belt prior to the inlet zone. Located behind this press belt grinding device, but still prior to the inlet zone of the double-band press, is a wiping device which removes the disengaged dirt particles and resin residues on the press belt as well as impurities located on the surface of the incoming copper foil web facing the press belt.

29 Claims, 5 Drawing Sheets

DOUBLE-BAND PRESS FOR CONTINUOUS PRODUCTION OF COPPER-LINED LAMINATES WITH AUXILIARY CLEANING EQUIPMENT

The present invention is directed to apparatus including a double-band press for the continuous production of copper-lined laminates, and particularly to auxiliary equipment used in such apparatus.

Copper-lined laminates which serve as basic starting materials for the production of printed circuit boards consist of a layered material or laminate core which has a galvanically deposited, precipitated copper foil on at least one surface which is securely connected with the surface. The layered material core is composed, in turn, of individual layers of supporting materials impregnated with duroplastic or thermosetting resin, for example, glass fiber woven cloth impregnated with epoxy resin which are pressed or molded simultaneously with the copper foil accompanied by heat and pressure. During the pressing, it is important that neither dust particles nor other foreign bodies be pressed into the outer surfaces of the copper foil remote of the layered material core, since, otherwise, flaws occur in the copper-lined laminate which lead to operating errors of the printed circuit board and ultimately to waste.

For the continuous production of such copper-lined laminates, a method which operates with a double-band press, and an apparatus therefor, are known from Offenlegungsschrift DE-OS No. 33 07 057. In this method, the supporting material webs and the copper foils are continuously drawn off by rollers, assembled to form a layered formation according to the structure desired and they are pressed in a double-band press to form a continuously advancing copper-lined laminate web. It is known from this prior art to arrange strippers consisting of elastic or resilient materials in the vicinity of the intake into the double-band press. These strippers contact the surfaces of the press belts of the double-band press as well as the surfaces of the copper foils remote from the layered material core and in so doing strip the dirt from these surfaces and collect this dirt in a channel or conduit from which it is then rinsed out.

It has been shown that such strippers are not capable of removing all the dust particles adhering on the metallic surfaces because of electrostatic attraction. In particular, there is the danger that this dust is only stirred up and subsequently settles on the surfaces again and then leaves behind harmful impressions on the surface of the copper-lined laminate during pressing. A further disadvantage is that the resin—which flows through pinholes in the copper surface during pressing from the supporting materials to the press belt and is hardened there, and that is possibly also connected with the copper portions torn out of the copper foil surface during separation of the laminate web from the press belts at the outlet of the double-band press—cannot be removed with such a stripper since it is fixedly connected with the press belt surface. Therefore, such residues repeatedly enter the inlet of the double-band press with the press belt and lead to periodically occurring flaws in the laminate web. Moreover, they increasingly build up since new residues can be added after every pass of the press belt without the earlier residues having been removed. Maintenance-free long-term operation is therefore not possible with such strippers.

SUMMARY OF THE INVENTION

The present invention is directed toward providing apparatus in a double-band press serving for the continuous production of copper-lined laminates which is suitable for insuring removal of all dirt, dust and stuck-on resin from the press belts of the double-band press, as well as from the copper foil, so that defects in the laminate surface because of impressions of such dirt particles during pressing are safely avoided.

The invention is embodied in apparatus which comprises a double-band press with two press belt units lying one above the other in a press frame, the press belt units, in turn, each comprising two rotatably supported deflecting drums and a press belt tensioned over the deflecting drums to form a reaction zone which exerts pressure between a lower belt side of the upper press belt and an upper belt side of the lower press belt. The apparatus provides continuous production of copper-lined laminates which are assembled from a layered material core, with copper foils firmly adhering to its surfaces, wherein the layered material webs for the layered material core and the copper foil webs are drawn off of rollers prior to the intake of the double-band press. The copper foil webs are applied against the press belts in the area of the deflecting rollers and they are brought together with the layered material webs prior to the reaction zone to form a layered formation which is subsequently pressed in the reaction zone of the double-band press to form a copper-lined laminate web. The invention is particularly characterized in that a press belt grinding device for the press belts is arranged prior to the intake zone into the double-band press as seen in the advancing direction of the press belt. This press belt grinding device executes movements such that grinding traces intersecting on the press belt are effected and it serves to disengage hardened resin residues or other impurities adhering to said press belt. A wiping device is arranged behind the press belt grinding device in the immediate vicinity of the intake zone for receiving disengaged impurities from the press belt as well as dust particles or other dirt particles which adhere to the surface which faces the press belt of said copper foil web running into the double band press.

The advantages attainable with the invention consist in that the press belt surface is completely cleansed of dirt, stuck-on resin residues, etc. prior to the inlet zone and the external surface of the copper-foil is likewise freed of all dust particles and broken-off dendrite which is formed during treatment for improved adherence on the surface of the copper-foil facing the layered material core, etc. After this cleaning, the outer surface of the copper foil lies on the press belt surface until the pressing is concluded so that no new dust can settle. Accordingly, copper-lined laminates are produced which are free of flaws and have a quality previously unknown.

The various features of novelty which characterize the invention are pointed out with specificity in the claims annexed to and forming a part of this disclosure. For a better understanding of the invention, its operating advantages and specific objectives attained by its use, reference should be had to the drawings and descriptive matter in which there are illustrated and described the preferred embodiments of the invention.

DETAILED DESCRIPTION OF THE PREFERRED EMBODIMENTS

Figure 1:
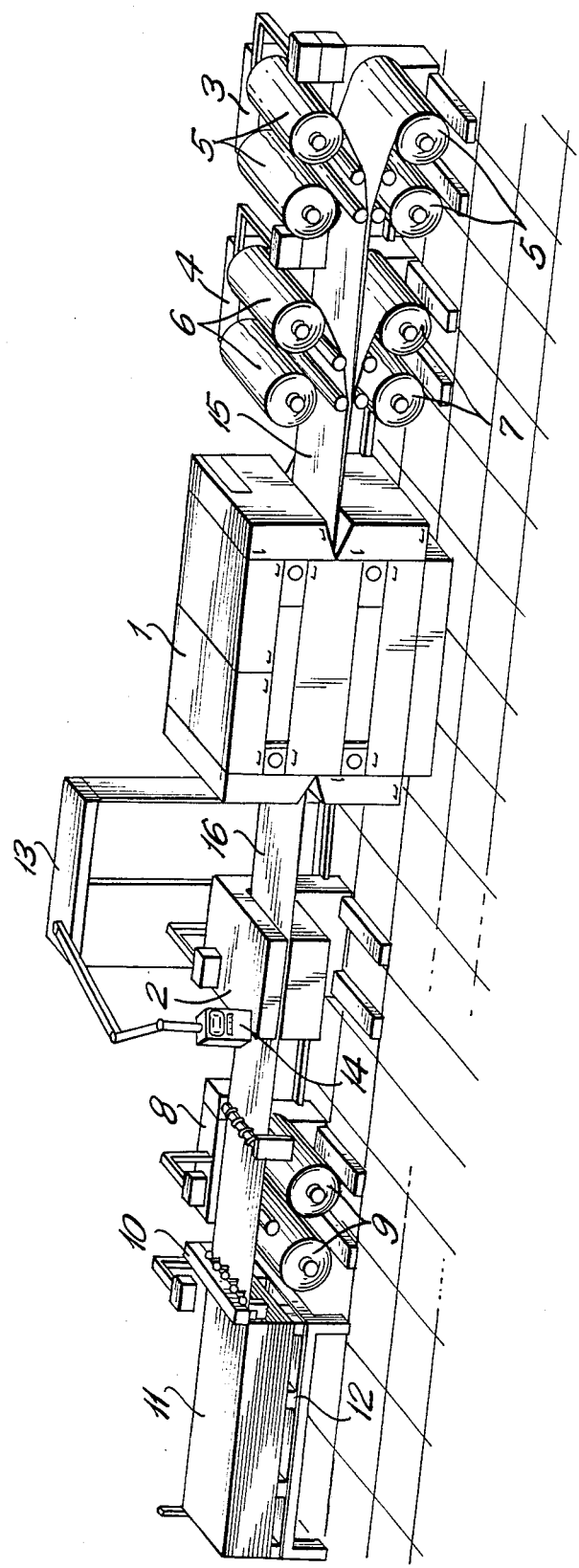
FIG. 1 is a perspective schematic view showing a production installation for the continuous production of copper-lined electrolaminates in accordance with the invention.

Referring now to the drawings, FIG. 1 shows a schematic representation of a production installation for the continuous production of copper-lined laminates including a double-band press 1. Located prior to the double-band press 1 are windoff units 3, 4, arranged one behind the other, their quantity being determined according to the construction of a copper-lined laminate which is to be produced by the apparatus of the invention. The windoff unit 3 carries rollers 5 for the layered material webs which are impregnated with precondensed duroplastic resins, for example, glass woven cloth webs impregnated with epoxy resin, while the windoff unit 4 carries rollers 6, 7 for the electrolytically deposited copper foil. The layered material webs are drawn off from the rollers 5 for the insulating layered material core of the copper-lined laminate and are brought together with the copper foils by the rollers 6, 7 to form a layered formation 15. This layered formation 15 is then pressed in the double-band press 1, under the influence of heat and surface pressure, to form a laminate web 16 which passes through a cooling device 2 at uniform speed after leaving the double-band press 1. In the case of a flexible copper-lined laminate web, the latter can then be wound up in a winding station 8 on rollers 9. Alternatively, the laminate web 16 can be divided up into sheets 11 in a cutting station 10 and stacked on pallets 12. The entire production installation is controlled by a computer in a control terminal 13 into which data is applied by the user via an input terminal 14.

Figure 2:
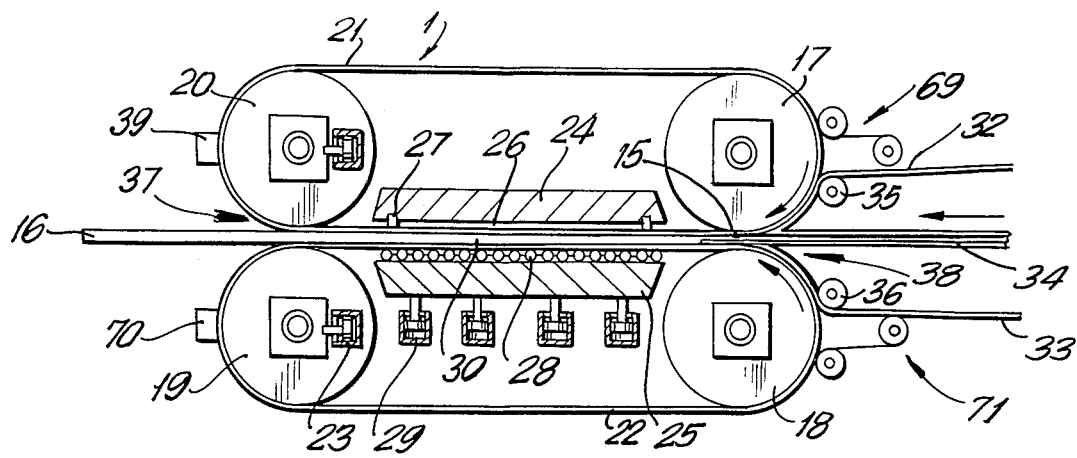
FIG. 2 is a schematic side view showing a double-band press.

The continuously working double-band press 1 is shown in FIG. 2. It has four deflecting drums or pulleys 17, 18, 19, 20 supported in a press frame which is omitted from the drawing for the sake of clarity. Press belts 21, 22 which are tensioned by means of hydraulic cylinders 23 are guided, respectively, around two deflecting drums which rotate in accordance with the arrows shown within the deflecting drums 17, 18. The layered formation 15 which advances from right to left in the drawing is pressed between the press belts 21, 22.

The pressure exerted on the layered formation 15 is hydraulically or mechanically applied to the insides of the press belts 21, 22 via pressure plates 24, 25 and is transmitted therefrom in a reaction zone 30 to the layered formation 15. During hydraulic pressure transmission, a fluid pressure medium which can be put under pressure, e.g., oil or air, is introduced into the space 26 which is defined above and below by the pressure plate 24 within the inside of the press belt 21 and which is sealed at the sides by the seal 27. For the purpose of mechanical pressure transmission, which is likewise explained in FIG. 2 by way of the lower press belt unit, stationary rollers 28 are arranged between the pressure plate 25 and the inside of the press belt 22. The pressure plate 25 and, accordingly, the rollers 28 are adjusted relative to the inside of the press belt 22 by means of hydraulic cylinders 29. If desired, the pressure transmission can also be effected in an hydraulic/mechanical combination by simultaneously applying the two principles described above.

Figure 7:
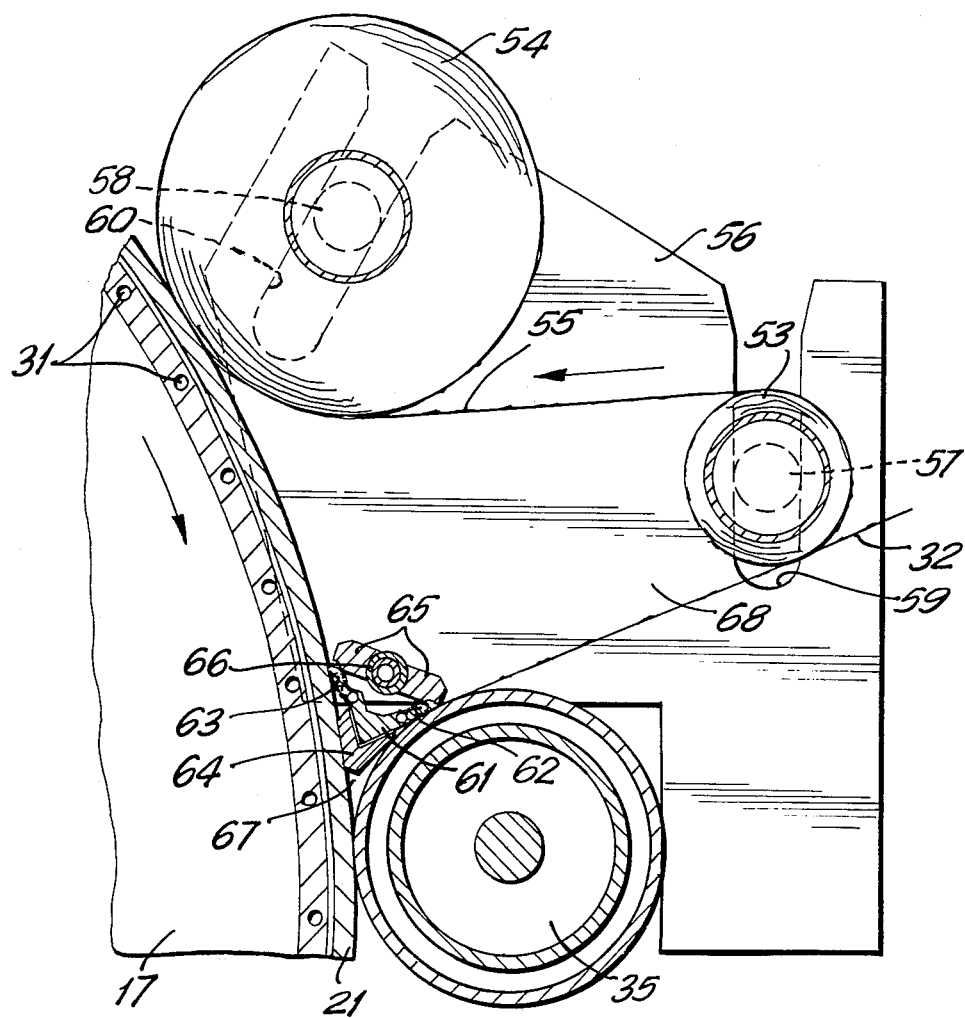
FIG. 7 is a section through the inlet zone of the double-band press equipped with a wiping device.

The deflecting drums 17, 18 on the inlet side are heated. For this purpose, boreholes 31 through which heated thermal oil flows are arranged in proximity to the outer surface area of the deflecting drums 17, 18 as shown in FIG. 7. By means of this, the outer surface area of the deflecting drums and, further, by means of heat conduction, the adjacent press belts 21, 22 are heated. The heat stored by the press belts 21, 22 is transported into the reaction zone 30 because of the thermal capacity of the belts and is there transmitted to the layered formation 15. In case this heat is not sufficient for curing or hardening the layered formation 15, there can be provided additional thermal bridges in the space 26 which transmit additional heat from the heated pressure plate 24 to the press belt 21. The construction of such thermal bridges is known and can be effected according to German Offenlegungsschrift DE-OS No. 33 25 578.

As can be seen in FIGS. 2 and 7, the in-running copper foil webs 32, 33 are guided before they are brought together with the layered material webs 34 to form the layered formation 15 in such a way that they lie against the press belts 21, 22 of the deflecting drums 17, 18 on the inlet side. Serving this purpose are deflecting drums 35, 36 which are constructed as rubber-coated rollers and which press the copper foil webs 32, 33 against the respective press belt 21, 22. By means of this, the copper foil web 32, 33 is heated to procedure temperature and wrinkling of the copper foil due to different thermal expansions during pressing with the layered material webs is avoided.

It is also important for the production of a high quality copper-lined laminate that the press belts 21, 22 of the double-band press 1 as well as the surfaces of the copper foil webs 32, 33 be free of impurities and dirt. Precisely during passage of the layered formation 15 through the reaction zone 30, resin flows out of the layered material web 34 through pores or pinholes of the copper foil webs 32, 33 because of the pressure and settles and cures on the press belt. Usually, this resin then simultaneously adheres with the surface of the copper foil remote from the layered material. When the laminate subsequently leaves the double-band press at the outlet and is separated from the press belts 21, 22 at the deflecting drums 19, 20, this connection is pulled apart, wherein portions of the copper foil with the resin continue to adhere to the press belt. These resin and copper foil residues adhering at the press belt must now be removed from the press belt before they come into contact again with the copper foil entering at the inlet into the double-band press since, otherwise, these impurities would press into the surface of the copper foil and cause destruction thereof so that periodic flaws would accordingly form in the electrolaminate web.

Figure 3:
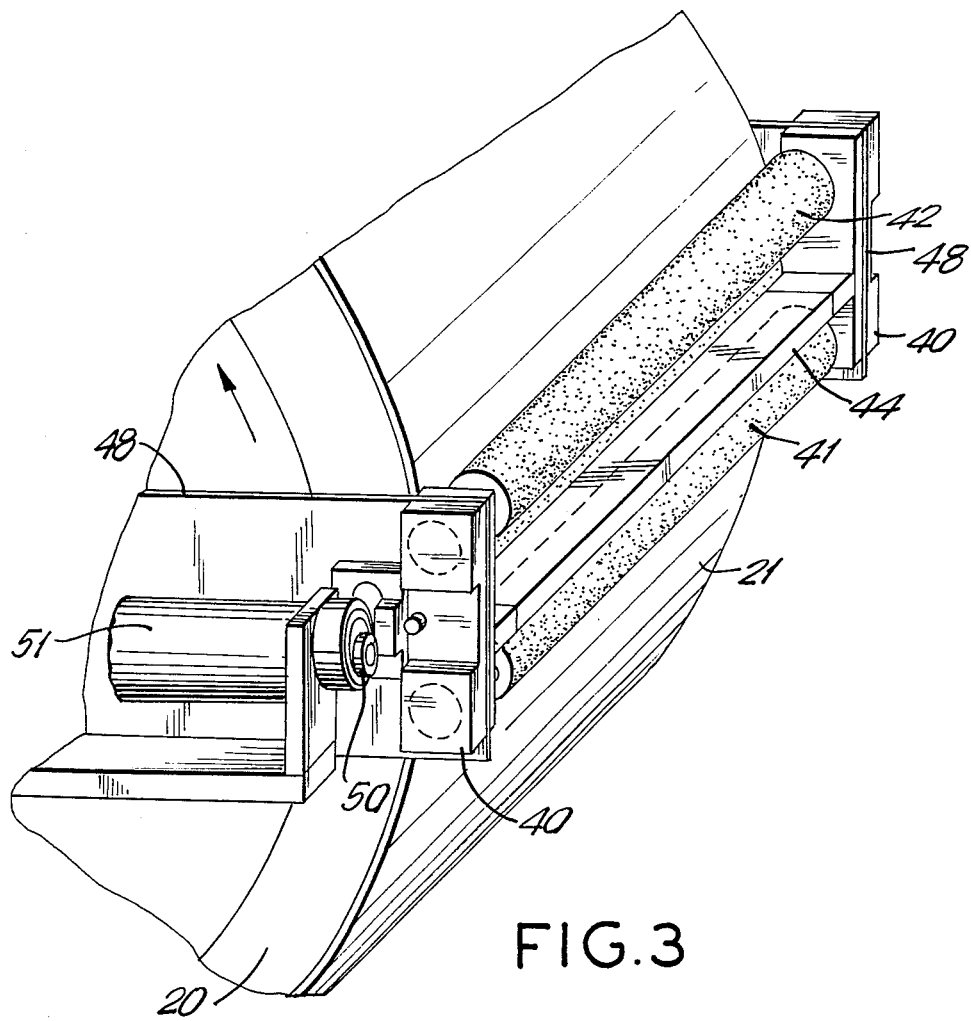
FIG. 3 is a perspective view from the rear of the double-band press showing a press band grinding or abrading device.
Figure 4:
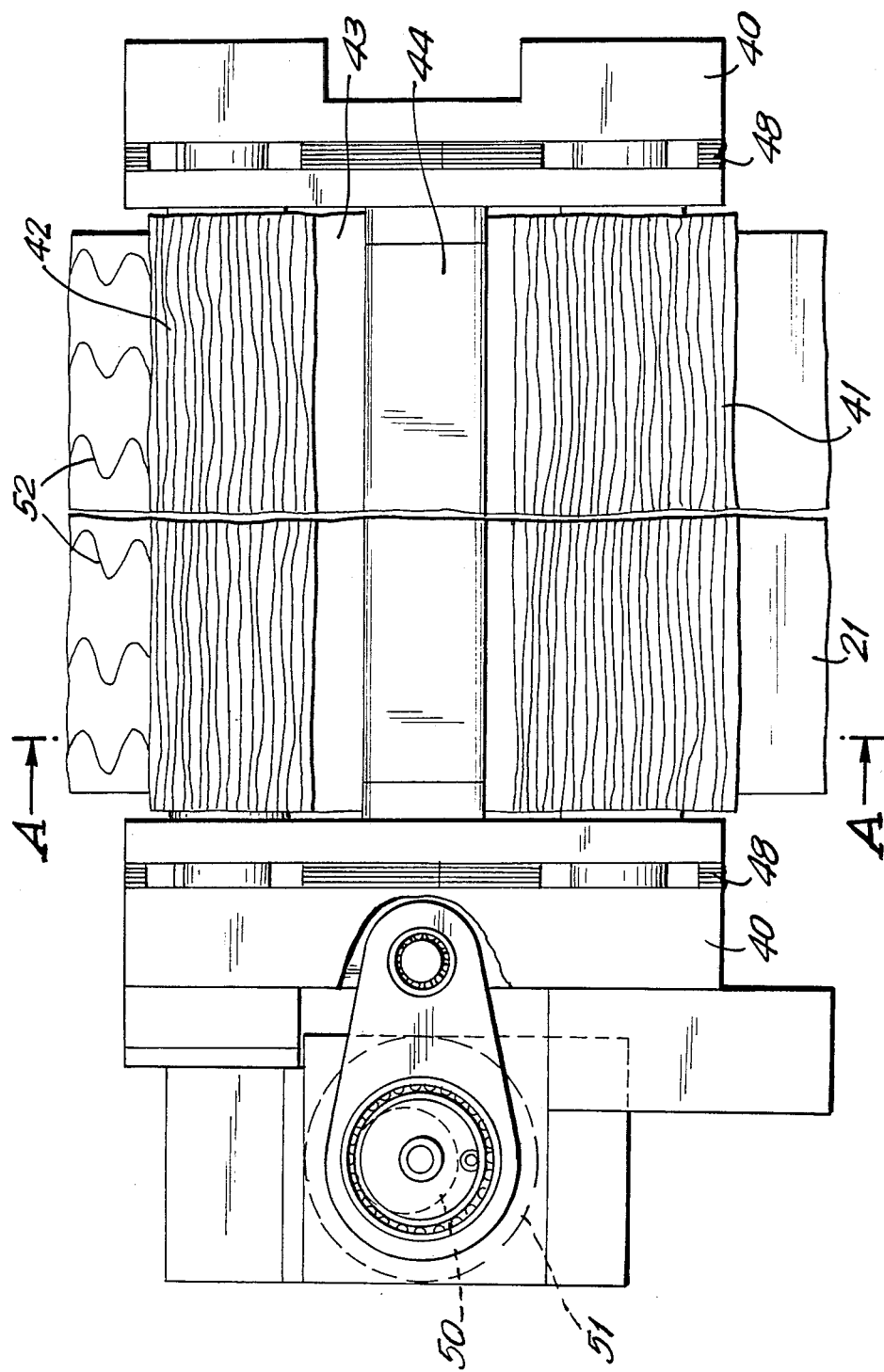
FIG. 4 is a top view of the press band grinding device.
Figure 5:
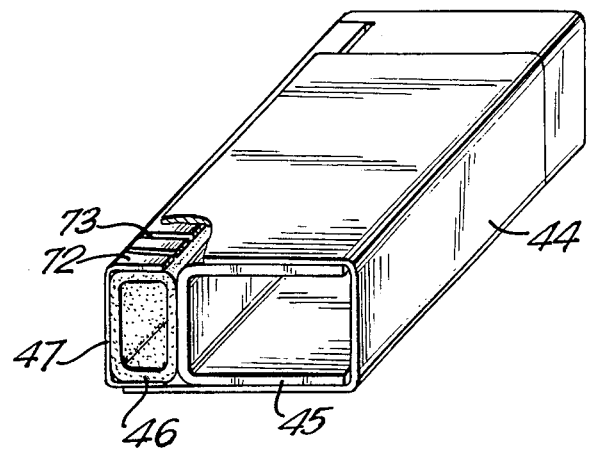
FIG. 5 is a perspective view of the grinding pad of the device of FIGS. 3 and 4.
Figure 6:
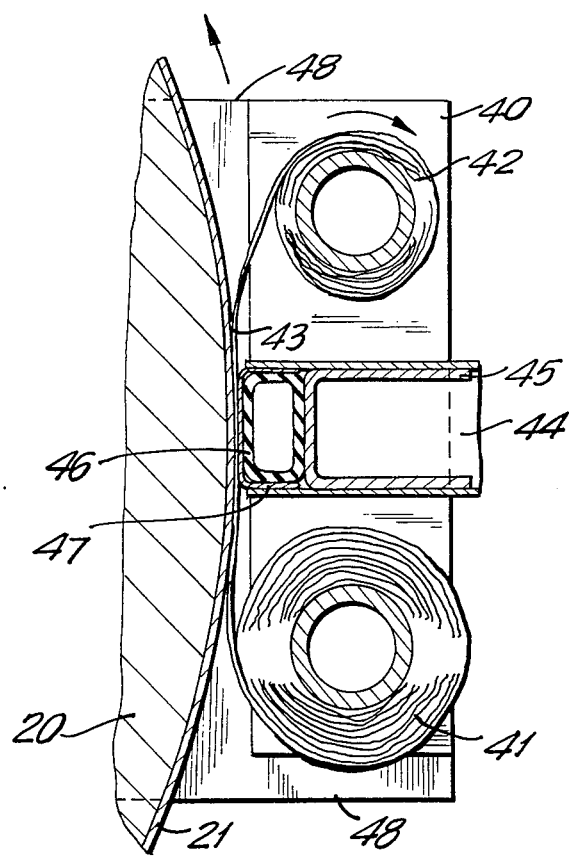
FIG. 6 is a section along line A—A of FIG. 4 through the press band grinding device.

For this purpose, a press band grinding device 39, seen in perspective from the rear of the double-band press 1 in FIG. 3 and from the top in FIG. 4, i.e., opposite the advancing direction of the laminate web, is arranged in the vicinity of the outlet zone 37 of the double-band press. The press belt grinding device 39 includes a pair of holding devices 40 located laterally at the circumference of the deflecting drum 20 at the outlet side and arranged at the press frame of the double-band press by means of leaf springs 48. A windoff roller 41 for a web-like grinding belt 43 with suitably selected grain and a respective windup roller 42 are located between the holding devices 40 so as to be rotatably supported and the width of the grinding belt 43 is identical to that of the press belt 21. The grinding belt 43 extending between the rollers 41 and 42 is pressed at the press belt 21 on an outer surface area of the deflecting roller 20 by means of a grinding pad 44 in such a way that its grain contacts the press belt 21 along its surface area with the desired contact pressure. The grinding pad 44 can be seen in a perspective partial section in FIG. 5 and in longitudinal section in FIG. 6. It comprises a frame 45 which is bent in a U-shape and supports a hose 46 filled with compressed air with the end facing the press belt. The side of the hose 46 remote of the frame 45 is provided with a U-shaped thin sheet metal member 47 which, in turn, lies against the grinding belt 43 in order to increase rigidity or stiffness. As can be seen in FIG. 5, plates 72 which are separated short distances by means of slots 73 are provided in the sides of the sheet metal member 47. By means of its plating, the member 47 is flexible in the transverse direction along the press belt so that it can adapt to the shape of the press belt 21 or of the deflecting drum 20 transversely along the width while being supported and reinforced by means of the contact pressure of the hose 46. Large defects, i.e., macro defects, such as differences in thickness, waves or defects in the shape of the press belt, are accordingly compensated for in that the member 47 with the hose 46 adapts to this contour.

As can be seen by reference to FIGS. 3 and 4, the grinding pad 44 is movable in the holding device 40 in the axial direction, i.e., transversely to the advancing direction of the press belt 21 by means of the springs 48 arranged at both sides of the belt 21. The grinding pad 44 is reciprocated in the axial direction by a motor 51 through a connecting rod which is arranged so as to be rotatable at a part of the holding device 40 by an eccentric cam 50 so that the grinding pad 44 executes an oscillating movement in the axial direction. Since the grinding belt 43 follows this oscillating movement because of the contact pressure of the grinding pad 44, the press belt 21 is treated by the grinding belt 43 and stuck-on resin residues and other impurities are loosened.

This axial movement of the grinding belt 43 is superimposed on the longitudinal movement of the press belts 21 so that grinding traces will thus have an approximately sinusoidal form, as is indicated in FIG. 4 by reference numeral 52. Accordingly, in a technical sense with respect to manufacture, rather than actual grinding or abrasion, there is obtained more of a honing operation. It is important for the grinding movement that the grinding traces intersect on the press belt. Accordingly grooves or unevenness are prevented from being formed in the press belt and by means of the slight material wear on the press belt surface, microcoarseness, i.e., small rough portions, on the press belt surface are evened. This effect is reinforced by means of the arrangement of the rollers for the grinding belt. The windoff roller 41 is arranged first and the windup roller 42 next, as seen in the advancing direction of the press belt. Accordingly, the new, unused grinding belt 43 engages with the dirt side first and takes up the hardened resin residues and copper foil residues. In so doing, the grinding belt gradually wears out. The used, already blunted or dulled portion of the grinding belt 43 then engages during the advancing of the press belt 21 with the portion of the press belt already cleaned beforehand and effects a mild action on the press belt surface which effects an evenness of the press belt surface which was previously acted upon more intensively. At advisably selected intervals, for example, when the portion of the grinding belt 43 pressed against the press belt 21 by the grinding pad 44 is completely blunted, the used piece of the grinding belt is wound up on the windup roller 42 so as to be controlled by the computer or operator, while an unused, fresh grinding belt is followed up by the windoff roller 41.

Figure 8:
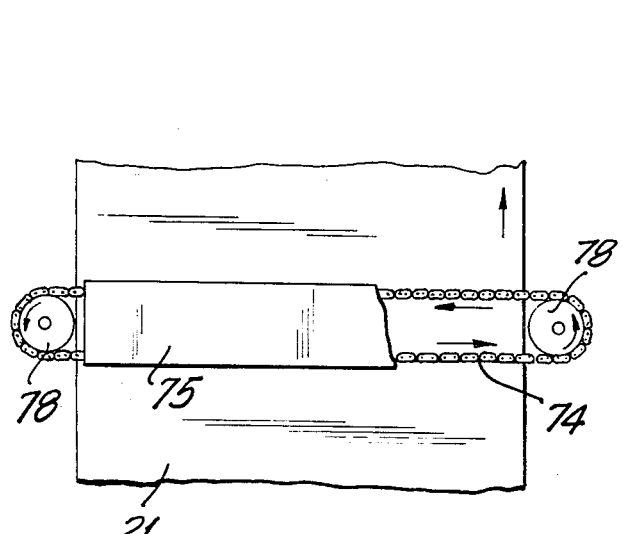
FIG. 8 is a top view of a press band grinding device formed with a chain.

Another embodiment for the press belt grinding device 39 is shown in FIG. 8 in a top view. This press belt grinding device which is arranged, in turn, in the vicinity of the outlet zone 37 consists of an endless chain 74 which is driven so as to circulate continuously in the direction of the arrow via two chain wheels 78. The chain wheels 78 are arranged laterally at the double-band press 1 outside the press belt 21 so that the chain 74 is moved along the entire width of the press belt. The halves of the chain 74 move in opposite directions, as can be seen in FIG. 8 by means of the arrows. The links of the chain 74 have honing stones which are stuck on the side facing the press belt 21 and are pressed against the press belt 21 by means of a holding device which is formed by a strip-like sheet metal member 75 in such a way that the honing stones grind the surface of the press belt. Intersecting grinding traces are obtained on the press belt surface by means of the opposite running directions of the two halves of the chain 74 superimposed by the movement of the press belt 21.

Figure 9:
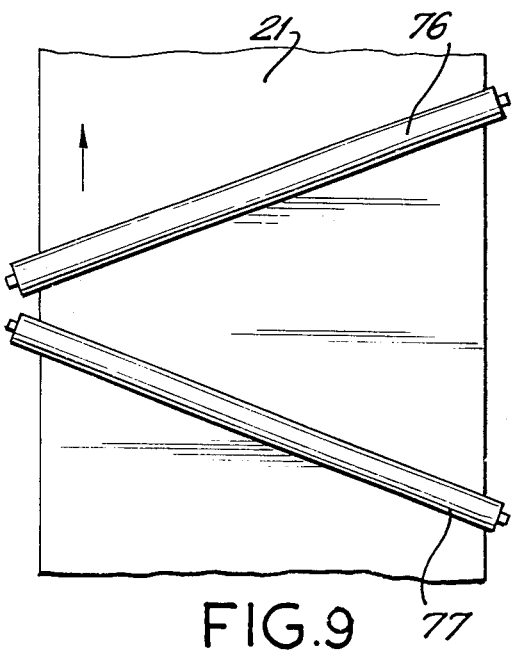
FIG. 9 is a top view of a press band grinding device which is formed by means of two grinding rollers.

FIG. 9 shows a press belt grinding device which is formed by means of two grinding rollers 76, 77. The two grinding rollers are set diagonally relative to the axial direction of the press belt 21, wherein the vertical direction relative to the advancing direction of the press belt is designated as the axial direction; that is, the grinding roller 76 is set at an angle of approximately +45° and the grinding roller 77 is set at an angle of approximately −45°. The two grinding rollers 76, 77 comprise a grain arranged at their outer surface area and are adjusted against the press belt surface accompanied by rotation opposite the advancing direction of the press belt for grinding. Intersecting grinding traces are obtained in turn by means of the superimposition with the advancing movement of the press belt.

The dirt and disengaged resin and copper residues loosened by means of the press belt grinding device 39 are transported from the press belt 21 in the direction of the inlet in the double-band press 1. Arranged in the vicinity of the inlet zone 38 is a wiping device 69 which then receives these disengaged impurities from the press belt. The press belt grinding devices shown in these embodiment examples are arranged in the vicinity of the outlet zone 37 for reasons of space. Although they can also be arranged closer to the inlet zone 38, it is important that they be arranged prior to the wiping device 69, as seen in the advancing direction of the press belt.

This wiping device 69 which is seen in FIG. 7 comprises a housing 56 which is fastened at the press frame. A windoff roller 53 and a windup roller 54 for a wiping cloth 55 are located in the housing 56, wherein their winding cores 57, 58 are rotatably supported in slots 59, 60 of the housing. The slot 60 is arranged in such a way that the wiping cloth 55 on the windup roller 54 contacts the press belt 21 on the deflecting drum 17 prior to the deflecting drum 35 for the copper foil 32, as seen in the advancing direction of the press belt 21, so as to grind. The wiping cloth 55 on the windoff roller 53 likewise contacts the in-running copper foil web 32 shortly before the deflecting drum 35, as seen in the advancing direction of the copper foil web 32. The winding cores 57 and 58 of both the windup roller and the windoff roller are displaced under the weight of the rollers in the slots 59 or 60 far enough so that the wiping cloth on the rollers always lies firmly against the press belt surface or the copper foil surface, respectively.

As the copper foil web 32 moves, its surface slides along the stationary wiping cloth 55 on the windoff roller 53 and dirt lying on the surface of the copper foil web remote of the layered material core as well as dust particles and broken off dendrite are held by the wiping cloth 55. Such broken off dendrite comes from the surface of the copper foil facing the layered material core. In order to improve the adherence of the copper foil on the layered material, the latter is provided with a treatment in which the surface accompanied by formation of dendrite is roughened. However, individual dendrites of this kind can break off when the copper foil is wound onto the roller and are then transported in the direction of the double-band press 1 with the copper foil web 32. The second surface of the wiping cloth 55 on the windup roller 54, which surface is still clean, slides on the moving surface of the press belt 21 and takes up the dirt and resin and copper residues disengaged by means of the press belt grinding device 39 so that the surface of the press belt 21 behind the windup roller 54 is again blank. At determined time intervals, the windup roller 54 is rotated a further distance corresponding approximately to the length of the surfaces between the wiping cloth 55 and the press belt 21 or the copper foil web 32, which surfaces contact one another, so that the soiled wiping cloth is wound up and unused wiping cloth engages with the press belt and the copper foil web. This further rotation can be carried out automatically by the computer or by control according to predetermined times or as a function of the distance of the press belt covered. If desired, further rotation can also be effected as deemed necessary by an operator on the basis of visual judgment of the dirtiness of the wiping cloth 55.

The wiping cloth 55 consists of a fiber woven fabric of bulky material, for example, flannel or tricot, wherein the dust particles and the dirt particles are caught in the fiber fabric and remain there. This effect can be enhanced by impregnating the wiping cloth with an alcohol or a somewhat adhesive liquid. A plastics material fleece consisting of very fine polypropylene fibers which are partially welded with one another has proven particularly suitable for the wiping cloth.

It can come about under certain circumstances that fibers which disengage from the wiping cloth 55 can be transported with the copper foil web 32 or the press belt 21 into the reaction zone 30 and can lead in turn to flaws in the copper-lined laminate because of impressions in the copper foil surface. In order to remove these fibers, a stripper 61 is located in a wedge-shaped gusset 67 formed by the press belt 21 and the copper foil web 32 running in over the deflecting drum 35. This stripper 61 has two lips consisting of an elastomer work material and arranged at a spring-mounted holder which adapts to the shape of the wedge-shaped portion 67, wherein one lip 62 contacts the copper foil web 32 so as to grind and the other lip 63 contacts the press belt 21 so as to grind. By means of this, such fibers are, in turn, stripped off and taken up by suction lips 65 which are located directly at these lips 62, 63. The suction lips 65 are connected with a suction tube 66 through which these fibers are removed prior to the inlet zone 38 by means of low pressure vacuum. The stripper 61 is provided with a reinforcement sheet metal 64 facing the wedge-shaped portion 67.

A space 68 which is enclosed by the windoff roller 53, the windup roller 54, the wiping cloth 55 lying between the windup and windoff rollers, the portion of the press belt 21 lying between the windup roller 54 and the deflecting drum 35, the stripper 61, the portion of the copper foil web 32 lying between the deflecting drum 35 and the windoff roller 53 and the housing 56, can be aerated by means of clean air which is fed by means of pressure. After the dirt adhering on the press belt or on the copper foil is removed with the wiping cloth 55 or the stripper 61, these surfaces only then come into contact with clean air which contains practically no dust particles which could settle on the surfaces. The copper foil web 32 lies against the press belt 21 by means of the deflecting drum 35 at the end of the clean air space 68 so that the two surfaces are protected relative to one another from newly settling dust. If necessary, the wedge-shaped portion 67 can likewise be aerated with clean air. Under certain circumstances, it can also suffice to aerate only the wedge-shaped portion 67 with clean air and not the space 68.

The functioning of the press belt grinding device 39 and wiping device 69 were explained with the aid of the above press belt unit which is formed by the deflecting rollers 17, 20 and the press belt 21. Such devices were also arranged at the lower press belt unit formed by the press belt 22 and the deflecting drums 18, 19. In so doing, an additional press belt grinding device 70 is located at the deflecting drum 19 in the vicinity of the outlet zone 37 and a wiping device 71 with a stripper 61 is located at the deflecting drum 18 in the vicinity of the inlet zone 38.

While specific embodiments of the invention have been shown and described in detail to illustrate the application of the inventive principles, it will be understood that the invention may be embodied otherwise without departing from such principles.

What is claimed is:

1. A double-band press compressing an upper press belt unit disposed above a lower press belt unit with said press belt units mounted in a press frame, each of said press belt units has a first end and a second end and includes two rotatably mounted deflecting drums with one deflecting drum at the first end and the other deflecting drum at the second end of said press belt unit, and an endless press belt tensioned over the deflecting drums and each said press belt having an upper belt portion and a lower belt portion extending between said deflecting drums with the lower portion of said press belt of said upper press belt unit and the upper portion of said press belt of said lower press belt unit disposed adjacent to one another and forming a reaction zone arranged to exert pressure on material passed through the reaction zone for the continuous production of copper-lined laminates assembled from a layered material core having an upper surface and a lower surface with copper foils firmly adhered to the upper and lower surfces, said press belt units forming an inlet zone into the reaction zone at the first ends of said press belt units where the material is fed into the reaction zone and an outlet zone at the second ends of said press belt units where the material exits from the reaction zone, rollers located upstream from the inlet zone for supporting the layered material core and copper foil webs and for supplying the material core nd the foil webs into the inlet zone, a deflecting roller located adjacent the inlet zone and upstream from the reaction zone and positioned adjacent said deflecting drum at the first end of each said press belt unit for guiding the copper foil web into contact with the press belt as the press belt passes over the deflecting drum at the first end when the foil web enters the inlet zone before contacting the material core, a press belt grinding device for contacting each said press belt at a position outside of the range of the inlet zone and reaction zone and arranged to remove hardened resin, residues and other impurities from the press belt, a wiping device arranged to contact each said press belt for removing dust and other particles from each said press belt and from the surfaces of the copper foil web moving into inlet zone, said wiping device arranged to contact the surface of the copper foil web which contacts the press belt as the web moves into contact with the press belt, said wiping device located between said grinding device and said inlet zone in the direction of movement of the press belt toward the inlet zone, and said wiping device comprises a first windoff roller and a first windup roller for a wiping cloth, wherein the improvement comprises that said press belt grinding device includes a grinding belt wound off a second windoff roller and wound on a second windup roller, a holding device secured to said press frame and supporting the second windoff roller and second windup roller, a contact pressure device located between the second windoff roller and second windup roller and supported in said holding device by leaf springs for moving the contact pressure device in a direction perpendicular to the movemnt of said press belt, means for moving said contact pressure device in an oscillating motion, and said means for moving comprising a motor and a cam with a connecting rod extending from said cam to said contact pressure device, said contact pressure device is positioned for pressing the grinding belt between the second windoff roller and second windup roller against the surface of the press belt for forming grinding traces intersecting on said press belt, said first windoff roller is spaced outwardly from said deflecting drum at the first end of the adjacent press belt unit and is located adjacent to the path of the copper foil web moving toward the inlet zone so that the wiping cloth on said first windoff roller contacts and wipes the surface of the copper foil web which surface faces said press belt, and said first windup roller is located adjacent the surface of said press belt passing over said deflecting drum at the first end of said press belt unit whereby the wiping cloth moving onto said first windup roller wipes the press belt surface of said press belt before said press belt is contacted by the copper foil web.

2. A double-band press according to claim 1, wherein said second windoff roller of said press belt grinding device is located upstream of said second windup roller relative to the direction of movement of said press belt over said deflecting drums.

3. A double-band press as set forth in claim 1, wherein said contact pressure device comprises a grinding pad including a hose arranged to be filed with compressed air for producing a contact pressure, a U-shaped sheet metal member supporting said hose with said sheet metal member located between said grinding belt and said hose, said U-shaped sheet metal member having a pair of spaced legs and a bight portion interconnecting said legs and said legs being divided by slots into a plurality of plates.

4. A double-band press, as set forth in claim 1, wherein said leaf springs having opposite ends with one end of said leaf spring being remote from said holding device and fastened to said press frame.

5. A double-band press, as set forth in claim 1, wherein said second windoff roller is spaced from said second windup roller in the direction of movement of said press belt so that said second windoff roller is located upstream from said second windup roller with said contact pressure device located between said second windoff roller and second windup roller so that said grinding belt is pressed by said contact pressure device against the press belt.

6. A double-band press, as set forth in claim 1, wherein said grinding belt is moved from said second windoff roller to said second windup roller by the length of said contract pressure device extending in the direction of movement of said press belt for effecting contact pressure for a predetermined interval of time.

7. A double-band press comprising an upper press belt unit disposed above a lower press belt unit with said press belt units mounted in a press frame, each of said press belt units has a first end and a second end and includes two rotatably mounted deflecting drums with one deflecting drum at the first end and the other deflecting drum at the second end of said press belt unit, and an endless press belt tensioned over the deflecting drums and each said press belt having an upper belt portion and a lower belt portion extending between said deflecting drums with the lower portion of said press belt of said upper press belt unit and the upper portion of said press belt of said lower press belt unit disposed adjacent to one another and forming a reaction zone arranged to exert pressure on material passed through the reaction zone for the continuous production of copper-lined laminates assembled from layered material core having an upper surface and a lower surface with copper foils firmly adhered to the upper and lower surfaces, said press belt units forming an inlet zone into the reaction zone at the first ends of said press belt units where the material is fed into the reaction zone and an outlet zone at the second ends of said press belt units where the material exits from the reaction zone, rollers located upstream from the inlet zone for supporting the layered material core and copper foil webs and for supplying the material core and the foil webs into the inlet zone, a deflecting roller located adjacent the inlet zone and upstream from the reaction zone and positioned adjacent said deflecting drum at the first end of each said press belt unit for guiding the copper foil web into contact with the press belt as the press belt passes over the deflecting drum at the first end when the foil web enters the inlet zone before contacting the material core, a press belt grinding device for contacting each said press belt at a position outside of the range of the inlet zone and reaction zone and arranged to remove hardened resin, residues and other impurities from the press belt, a wiping device arranged to contact each said press belt for removing dust and other particles from each said press belt and from the surface of the copper foil web moving into the inlet zone, said wiping device arranged to contact the surface of the copper foil web which contacts the pressbelt as the web moves into contact with the press belt, said wiping device located between said grinding device and said inlet zone in the direction of movement of the press belt toward the inlet zone, and said wiping device comprises a first windoff roller and a first windup roller for a wiping cloth, wherein a press belt grinding device comprises an endless chain formed of links with honing stones mounted in said links, a pair of chain wheels each located laterally outwardly on an opposite side of said press belt with said chain wheels each having an axis extending trnasversely of the adjacent surface of said press belt and asid chain extends around asaid chain wheels and has a first portion and a second portion extending between said chain wheels located adjacent said press belt, a holding device located adjacent said first and second portions of said chain and pressing said links of said chain against the surface of said press belt whereby said honing stones in said links in each of said first and second portions of said chain press against said press belt, and said honing stones form intersecting grinding traces on said press belt due to opposite movement of the first and second portions of said chain relative and superimposed on the movement of said press belt, and said wiping device is located between said chain and said inlet zone in the direction of movement of said press belt and said wiping cloth is arranged on said first windoff roller so that a portion of said cloth on said first windoff roller contact the copper web foil moving into contact with said press belt in said inlet zone whereby the surface of the foil web contacting said press belt is wiped, and said first windup roller is arranged relative to said press belt so that said cloth wound onto said first windup roller wipes the surface of said press belt at a location spaced upstream from said inlet zone.

8. A double-band press, as set forth in claim 7, wherein said holding device is a strip-like sheet metal member pressing against the first and second portions of said chain so that the honing stones grind the surface of said press belt.

9. A double-band press, as set forth in claim 7, wherein said honing stones are secured to the links of said chain.

10. A double-band press comprising an upper press belt unit disposed above a lower press belt unit with said press belt units mounted in a press frame, each of said press belt units has a first end and a second end and includes two rotatably mounted deflecting drums with one deflecting drum at the first end and the other deflecting drum at the second end of said press belt unit, and an endless pressbelt tensioned over the deflecting drum and each said press belt having an upper belt portion and a lower belt portion extending between said deflecting drums with the lower portion of said press belt of said upper press belt unit and the upper portion of said press belt of said lower press belt unit disposed adjacent one another and forming a reaction zone arranged to exert pressure on material passed through the reaction zone for the continuous production of copper-lined laminates assembled from a layered material core having an upper surface and a lower surface with copper foils firmly adhered to the upper and lower surfaces, said press belt units forming an inlet zone into the reaction zone at the first ends of said press belt units where the material is fed into the reaction zone and an outlet zone at the second ends of said press belt units where the material exits from the reaction zone, rollers located upstream from the inlet zone for supporting the layered material core and copper foil webs and for supplying the material core and the foil webs into the inlet zone, a deflecting roller located adjacent the inlet zone and upstream from the reaction zone and positioned adjacent said deflecting drum at the first end of each said press belt unit for guiding the copper foil web into contact with the press belt as the press belt passes over the deflecting drum at the first end when the foil web enters the inlet zone before contacting the material core, a press belt grinding device for contacting each said press belt at a position outside of the range of the inlet zone and reaction zone and arranged to remove hardened resin, residues and other impurities from the press belt, a wiping device arranged to contact each said press belt for removing dust and other particles from each said press belt and from the surface of the copper foil web moving into the inlet zone, said wiping device arranged to contact the surface of the copper foil web which contacts the press belt as the web moves into contact with the press belt, said wiping device located between said grinding device and said inlet zone in the direction of movement of the press belt toward the inlet zone, and said wiping device comprises a first wind off roller and a first wind up roller for a wiping cloth, wherein said press belt grinding device comprises a pair of grinding rollers spaced apart in the direction of movement of said press belt around said deflecting drums and said grinding rollers being adjustable moundted against the surface of said press belt for rotation in the direction opposite to the direction of the movement of said press belt, said grinding rollers arranged to converge toward one another from one side of said press belt to the other so that said rollers each have an axis extending at an acute angle to the edges of said press belt, whereby said grinding rollers provide grinding traces intersecting on the surface of said press belt.

11. A double-band press, as set forth in claim 1, 7, or 10, wherein said press belt grinding device comprises a grinding device for each of said upper and lower press belts.

12. A double-band press, as set forth in claim 1, 7 or 10, wherein said wiping means comprises a pair of wiping devices, one for said upper press belt and one for said lower press belt.

13. A double-band press, as set forth in claim 1, 7 or 10, wherein said press belt grinding device is arranged adjacent the outlet zone of said press belt units.

14. A double-band press, as set forth in claim 1, 7 or 10, wherein said wiping device is located adjacent the inlet zone of said press belt units upstream from said deflecting roller which initially presses the copper foil web against the press belt on said deflecting drums at the first ends of said press belt units.

15. A double-band press, as set forth in claim 1, 7 or 10, wherein said first windoff roller and said first windup roller rotate in opposite directions so that one surface of said wiping cloth contacts the copper foil web and the other surface of said wiping cloth contacts said press belt.

16. A double-band press, as set forth in claim 15, wherein a housing fastened to said press frame supports said first windoff roller and said first windup roller, said housing has slots therein for supporting said first windoff roller and said first windup roller.

17. A double-band press, as set forth in claim 16, wherein said slots in said housing are arranged so that said first windoff roller moves under the effect of gravity toward the surface of the copper foil web and said first windup roller moves under the effect of gravity toward the surface of said press belt.

18. a double-band press, as set forth in claim 1, 7, or 10, wherein said wiping cloth is a woven textile fabric.

19. A double-band press, as set forth in claim 18, wherein said wiping cloth is flannel.

20. A double-band press, as set forth in claim 18, wherein said wiping cloth is tricot.

21. A double-band press, as set forth in claim 1, 7 or 10, wherein said wiping cloth is a woven fabric of fine polypropylene fibers bonded with one another.

22. a double-band press, as set forth in claim 18, wherein the woven fabric of said wiping cloth is impregnated with a substance for enhancing the disengagement of impurities from the surfaces wiped by said wiping cloth.

23. A double-band press, as set forth in claim 22, wherein the woven fabric of said wiping cloth is impregnated with alcohol.

24. A double-band press, as set forth in claim 18, wherein the woven fabric of said wiping cloth is impregnated with a sticky substance.

25. A double-band press, as set forth in claim 1, 7 or 10, wherein said wiping cloth is moved from said first windoff roller to said first windup roller intermittently so that after a section of the wiping cloth has become soiled during the wiping operation, said first windoff and windup rollers are moved by a length of the wiping cloth corresponding approximately to the length contacting the surfaces of the copper foil web and said press belt.

26. A double-band press, as set forth in claim 1, 7, or 10, wherein said first windoff roller and said first windup roller are moved intermittently after a predetermined interval for a length corresponding to the length of the wiping cloth in contact with one of the press belts and the copper foil web.

27. a double band press, as set forth in claim 1, 7 or 10, wherein a stripper is located adjacent said inlet zone downstream in the path of movement of at least one of said press belts from said first windup roller, said stripper having a first lip and a second lip each formed of an elastomer with said first lip arranged to contact the copper foil web moving toward contact with said press belt and said second lip disposed in contact with said press belt at a position upstream from the position where the copper foil web contacts said press belt, and a first suction lip and a second suction lip connected to a suciton pipe for removing fibers and dust with said suction lips located adjacent to said first and second lips and remote relatively thereto from said inlet zone.

28. a double band press, as set forth in claim 27, wherein a space adjacent said deflecting roller at the first end of said press belt unit is bounded by said first windoff roller, said first windup roller, said wiping cloth extending between the first windup roller and the first windoff roller, the press belt located between the first windup roller and the deflecting roller, the stripper, the copper foil web located between the first windoff roller and the deflecting roler and side walls of said housing, and said space is arranged to be aerated by clean air supplied pressure.

29. A double band press, as set forth in claim 28, wherein said stripper has a wedge-shaped gusset space located between the inlet zone and said space and said gusset space is defined by said press belt, the copper foil web on said deflecting roller, and said stripper and said gusset space is arranged to be aerated by clean air supplied under pressure.

* * * * *